United States Patent
Goh et al.

(10) Patent No.: US 8,907,465 B2
(45) Date of Patent: Dec. 9, 2014

(54) METHODS AND DEVICES FOR PACKAGING INTEGRATED CIRCUITS

(71) Applicant: STMicroelectronics Pte Ltd., Singapore (SG)

(72) Inventors: Kim-Yong Goh, Singapore (SG); Yiyi Ma, Singapore (SG); Wei Zhen Goh, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 0 days.

(21) Appl. No.: 13/853,645

(22) Filed: Mar. 29, 2013

(65) Prior Publication Data

US 2014/0291782 A1    Oct. 2, 2014

(51) Int. Cl.
*H01L 23/02* (2006.01)
*B81C 1/00* (2006.01)
*B81B 7/00* (2006.01)

(52) U.S. Cl.
CPC ......... *B81C 1/00269* (2013.01); *B81C 1/00492* (2013.01); *B81B 7/0061* (2013.01); *B81C 1/00309* (2013.01); *B81B 7/0058* (2013.01)
USPC .................. 257/686; 247/E21.499; 247/783; 438/109; 438/118; 438/106; 438/121; 438/125

(58) Field of Classification Search
CPC ....................................................... H01L 23/00
USPC .................. 257/E21.499, E27.013, 686, 783; 438/109, 118, 15, 106, 121, 125
See application file for complete search history.

(56) References Cited

U.S. PATENT DOCUMENTS

| | | | | |
|---|---|---|---|---|
| 6,707,163 | B2 * | 3/2004 | Chiu | 257/783 |
| 8,603,860 | B2 * | 12/2013 | Chen et al. | 438/106 |
| 2002/0149106 | A1 * | 10/2002 | Chiu | 257/738 |
| 2008/0266003 | A1 * | 10/2008 | Yamashita | 331/68 |
| 2009/0294931 | A1 * | 12/2009 | Sham et al. | 257/660 |
| 2013/0102112 | A1 * | 4/2013 | Chen et al. | 438/118 |
| 2013/0193571 | A1 * | 8/2013 | Huang | 257/737 |

* cited by examiner

*Primary Examiner* — Telly Green
(74) *Attorney, Agent, or Firm* — Gardere Wynne Sewell LLP

(57) ABSTRACT

Methods and devices for packaging integrated circuits. A packaged device may include an integrated circuit, a first packaging component including a patterned surface, and a second packaging component. The patterned surface of the first packaging component may be adhesively coupled to a surface of the second packaging component or a surface of the integrated circuit. The integrated circuit may be at least partially enclosed between the first and second packaging components. A packaging method may include patterning a surface of a packaging component of an integrated circuit package. The surface of the packaging component may be for adhesively coupling to a second component to at least partially enclose an integrated circuit in the integrated circuit package.

18 Claims, 11 Drawing Sheets

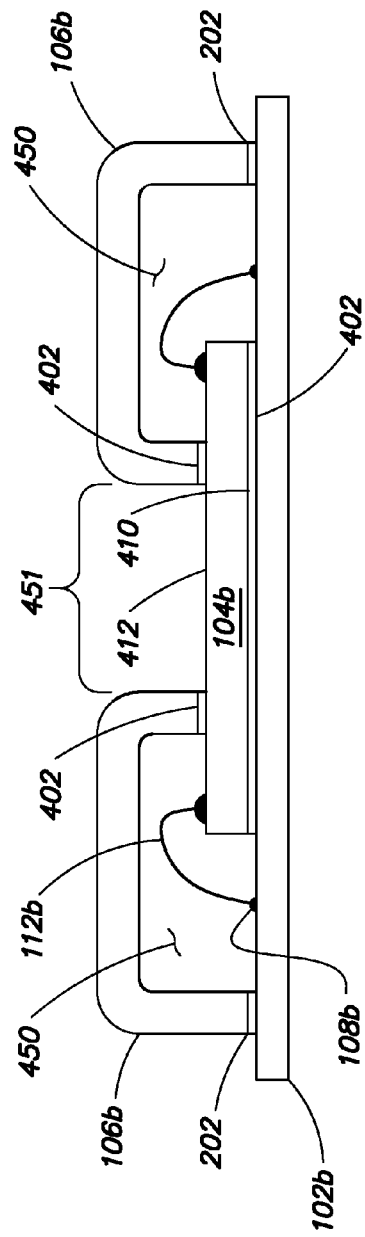
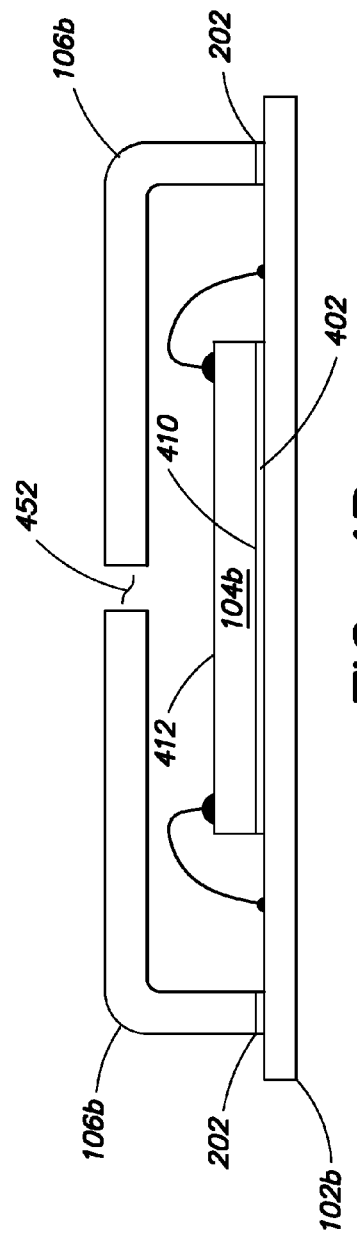
FIG. 4A
FIG. 4B

US 8,907,465 B2

METHODS AND DEVICES FOR PACKAGING INTEGRATED CIRCUITS

BACKGROUND

1. Technical Field

The present disclosure relates to methods and devices for packaging integrated circuits. Some embodiments of the present disclosure relate particularly to packaging techniques that protect integrated circuits (ICs) and open-cavity integrated circuit (IC) packages from potential sources of damage, such as the forces that are exerted on an IC package when an electronic device containing the IC package is dropped.

2. Discussion of the Related Art

Packaging is a stage of integrated circuit manufacturing in which an integrated circuit (e.g., semiconductor die, die, semiconductor chip, integrated circuit chip, IC, IC chip, etc.) is fully or partially enclosed in a package. The package may protect components of the IC from potential sources of damage, such as heat, moisture, unsuitable physical contact, etc. Alternatively or additionally, the package may provide electrical contacts for connecting the components of the IC to other electronic devices.

In some circumstances, it may be desirable to enclose only a portion of an IC within a package. For example, if an IC is designed to sense a characteristic, such as sound or pressure, of an environment outside the IC package, enclosing the IC's sensor component in a package may interfere with the sensor's ability to accurately sense characteristics of that environment. A microphone is just one example of an IC sensor that may perform better when the sensor is accessible to the environment outside an IC package.

In order to provide the benefits of packaging while making at least a portion of an IC (e.g., a sensor portion) accessible to the environment outside the IC package, an open-cavity package may be used. In an open-cavity package, components of the package may form an open cavity, through which portions of the IC remain accessible to the environment.

SUMMARY

According to one embodiment, a method is provided that includes patterning a surface of a packaging component of an integrated circuit package. The surface of the packaging component is for adhesively coupling to a second component to at least partially enclose an integrated circuit in the integrated circuit package.

According to another embodiment, there is provided a packaged device. The packaged device includes an integrated circuit, a first packaging component including a patterned surface, and a second packaging component. The patterned surface of the first packaging component is adhesively coupled to a surface of the second packaging component or a surface of the integrated circuit. The integrated circuit is at least partially enclosed between the first and second packaging components.

According to another embodiment, there is provided a packaged device. The packaged device includes an integrated circuit, a first packaging component, and a second packaging component. An adhesive material couples a surface of the first packaging component to a surface of the second packaging component or to a surface of the integrated circuit. The packaged device also includes means for maintaining adhesive coupling between the first and second packaging components or between the first packaging component and the integrated circuit by terminating a crack in the adhesive material at a surface of the first packaging component, at a surface of the second packaging component, and/or at a surface of the integrated circuit. The integrated circuit is at least partially enclosed between the first and second packaging components.

BRIEF DESCRIPTION OF THE DRAWINGS

For an understanding of some embodiments, reference will now be made by way of example only to the accompanying figures in which:

FIG. 4A shows a cross-section of packaged integrated circuit 100b along A-A, according to some embodiments;

FIG. 4B shows another cross-section of packaged integrated circuit 100b along A-A, according to some embodiments;

Figure 1:
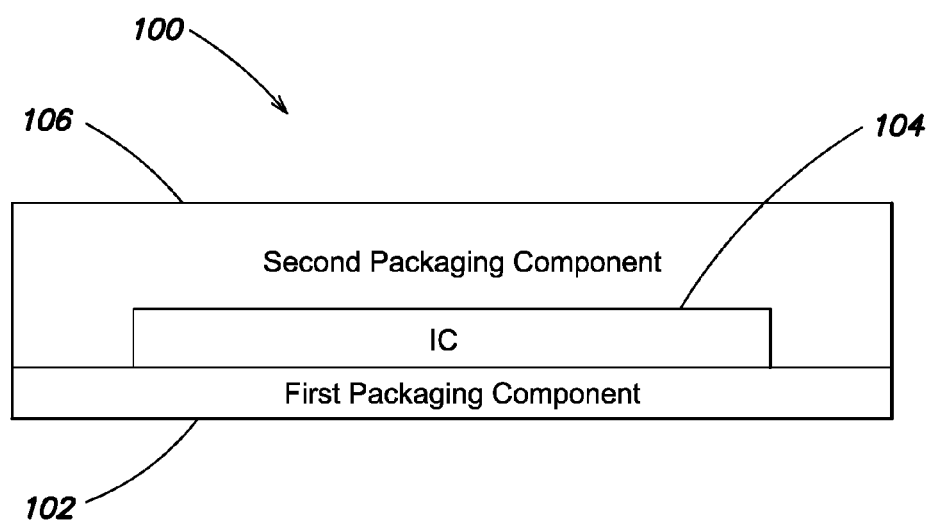
FIG. 1 shows a block diagram of a packaged integrated circuit (IC), according to some embodiments.

For clarity, the same elements have been designated with the same reference numerals in the different drawings and, further, as usual in the representation of integrated circuits, the various drawings are not to scale. For clarity, only those steps and elements which are useful to the understanding of the described embodiments have been shown and will be discussed.

DETAILED DESCRIPTION

When electronic devices (e.g., laptop computers, mobile phones, smart phones, and tablet computers) are dropped, thrown, jostled, or otherwise subjected to strong physical forces, integrated circuits (ICs) and integrated circuit packages contained in the electronic devices may be damaged. For example, the application of such forces to an electronic device may cause components of an IC package to detach from one another, rendering the IC within the package inoperable or interfering with the IC's performance, even in cases where the IC itself is not damaged. The failure rates of open-cavity IC packages for IC sensors, such as microphones, may be particularly high. In some cases, the detachment of components of the open-cavity IC package may occur because the forces applied to the electronic device cause cracks to form in an adhesive that attaches the components of the package to each other. The inventors have recognized and appreciated that patterning the surfaces of packaging components joined by an adhesive may limit the extent of cracks that form in the adhesive, thereby preventing the components of the IC package from becoming detached and prolonging the useful life of the IC contained within the package.

According to an embodiment, a surface of an IC packaging component may be patterned. The surface of the IC packaging component may be for adhesively coupling to a second IC packaging component to fully or partially enclose a semiconductor die between the packaging components. In some embodiments, the surface of the IC packaging component may be patterned by forming a surface material of the IC packaging component according to a pattern. In some embodiments, the pattern may be a pattern of cavities and/or protrusions. In some embodiments, the pattern may be a repeating pattern. In some embodiments, the surface material may be formed by screen printing the surface material according to the pattern, by depositing the surface material and removing portions of the surface material according to the pattern, and/or by photo-lithographically patterning the surface material.

According to another embodiment, the surface of the second IC packaging component may also be patterned.

According to another embodiment, pattern elements (e.g., cavities and/or protrusions) formed in the surface material may arrest the progress of cracks that form in an adhesive material that joins the IC packaging components.

The features described above, as well as additional features, are described further below. These features may be used individually, all together, or in any combination, as the technology is not limited in this respect.

FIG. 1 shows a block diagram of a packaged integrated circuit (IC) 100, according to some embodiments. The packaged IC 100 of FIG. 1 includes a first packaging component 102 and a second packaging component 106 which partially or fully enclose an integrated circuit 104. In some embodiments, the first packaging component 102 may be a substrate, such as a plastic, ceramic, glass, or metal substrate. In some embodiments, the substrate may be a printed circuit board or a leadframe. In some embodiments, the second packaging component may be a lid, such as a plastic, ceramic, glass, or metal lid.

The packaging components illustrated in FIG. 1 may perform one or more functions. In some embodiments, the packaging components may protect the IC from damage (e.g., from moisture, corrosion, heat, physical forces, etc.). In some embodiments, the packaging components may dissipate heat produced by the IC. In some embodiments, the packaging components may provide electrical contacts (e.g., pins or leads) for electrically coupling the IC to other devices, such as other devices on a printed circuit board.

The IC 104 illustrated in FIG. 1 may be attached to the first packaging component 102 and/or the second packaging component 106, e.g. by an epoxy die attachment method, a eutectic die attachment method, or any other means known to one of ordinary skill in the art or otherwise suitable for attaching an IC to a packaging component. In some embodiments, a die attach material may be used to attach the IC 104 to a packaging component. The die attach material may be, for example, epoxy, solder, or any other material known to one of ordinary skill in the art or otherwise suitable for attaching an IC to a packaging component.

First packaging component 102 and second packaging component 106 may be attached to each other. In some embodiments, a surface of first packaging component 102 and a surface of second packaging component 106 may be attached by an adhesive substance applied between the surfaces. The adhesive substance may form an adhesive layer between the surfaces. The adhesive substance may be applied using any technique known to one of ordinary skill in the art or otherwise suitable for applying an adhesive to IC packaging components, including but not limited to dispensing, jetting, printing, and/or curing. The adhesive substance be any substance known to one of ordinary skill in the art or otherwise suitable for attaching IC packaging components, including but not limited to epoxy, solder, solder paste, glue, glass paste, and/or ceramic powder.

The IC 104 illustrated in FIG. 1 may be any type of integrated circuit. For example, IC 104 may be the product of any integrated circuit fabrication process known to one of ordinary skill in the art or otherwise suitable for fabricating an integrated circuit, including but not limited to a monolithic process, a hybrid process, a heterogeneous process, a CMOS (complementary metal-oxide semiconductor) process, and/or a MEMS (micro-electromechanical systems) process. As another example, IC 104 may have any geometry known to one of ordinary skill in the art or otherwise suitable for an IC, including but not limited to a planar geometry or a three-dimensional geometry, such as a stacked-die geometry. As yet another example, IC 104 may implement any circuit or perform any function known to one of ordinary skill in the art or otherwise suitable for an IC, including but not limited to communication, processing, and/or sensing. In some embodiments, IC 104 may include a pressure sensor, a temperature sensor, a light sensor, an acoustic sensor, and/or a microphone.

Although FIG. 1 illustrates a packaged IC 100 with a single IC 104, in some embodiments the packaged IC may include two or more ICs. In embodiments where the packaged IC 100 includes two or more ICs 104, any two of the two or more ICs may be coupled to each other, e.g., by wire bonding or wireless communication means.

An IC 104 may be fully or partially enclosed within IC packaging components (102, 106). When an IC 104 is fully enclosed by the IC packaging components, the IC is inaccessible from outside the package. For example, when the IC packaging components form a hermetically sealed cavity and all portions of an IC 104 are enclosed within the cavity, the IC is fully enclosed. When an IC 104 is partially enclosed by the IC packaging components, the IC is at least partially accessible from outside the package. For example, when at least a portion of an IC 104 is accessible to air from outside the package, the IC is partially enclosed.

Figure 2:
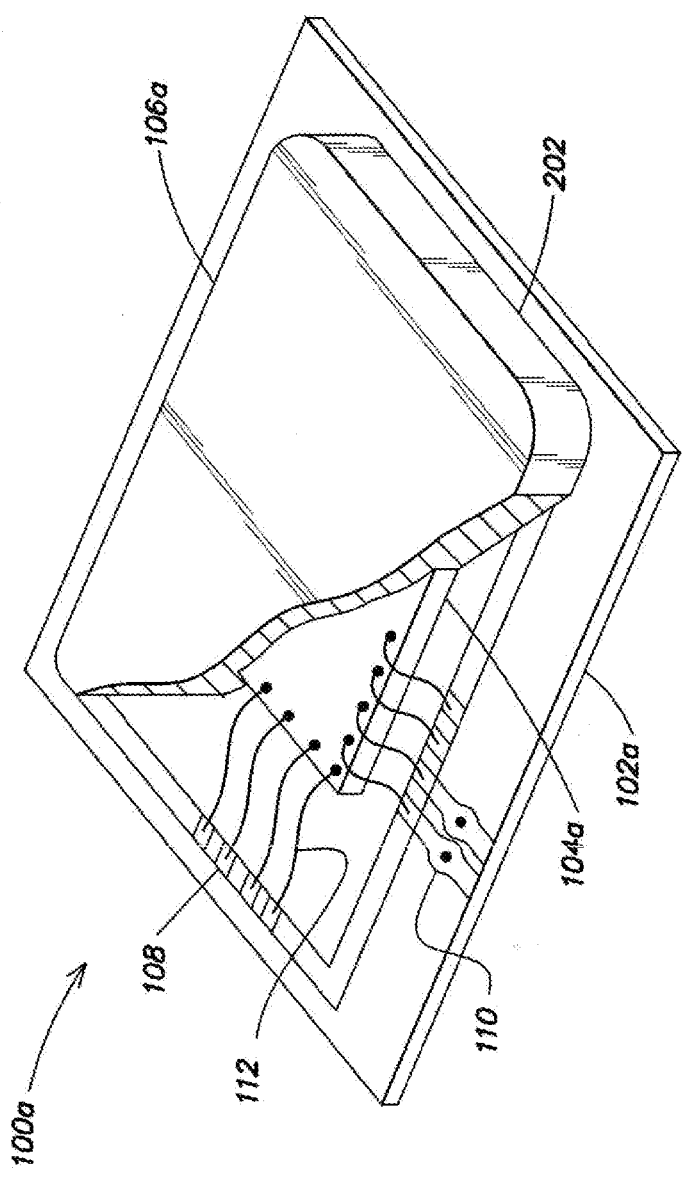
FIG. 2 shows a cutaway perspective view of a packaged integrated circuit 100a, according to some embodiments.

FIG. 2 shows a cutaway perspective view of a packaged integrated circuit 100*a*, according to some embodiments. In the packaged IC 100*a* of FIG. 2, an IC 104*a* is fully enclosed in a cavity formed by first packaging component 102*a* and second packaging component 106*a*. In some embodiments, IC 104*a* may be attached to the first packaging component 102*a* and/or to the second packaging component 106*a*. In some embodiments, first packaging component 102*a* and second packaging component 106*a* may be attached to each other by an adhesive 202. In some embodiments, the adhesive may form a thin layer or film between surfaces of the first and second packaging components (102a, 106a). Although a single IC 104a is visible in FIG. 2, some embodiments of packaged IC 100a may include two or more ICs.

In the example of FIG. 2, the perimeter of first packaging component 102a extends beyond the perimeter of second packaging component 106a. Embodiments are not limited in this regard. In some embodiments perimeters of the first and second packaging components may be coextensive in full or in part.

In the example of FIG. 2, IC 104a is electrically coupled to first packaging component 102a. In particular, electrical conductors 112 (e.g., wires) are connected between IC 104a and contact pads 108 of first packaging component 102a. The contact pads 108 are coupled to conductor traces 110. In some embodiments, the conductor traces 110, contact pads 108, and electrical conductors 112 may carry electrical signals to or from IC 104a. In some embodiments, adhesive layer 202 may be applied on or over at least portions of the contact pads 108 and/or conductive traces 110. Although FIG. 2 illustrates conductive traces on the upper surface of IC 104a, embodiments are not limited in this regard. IC 104a may be electrically coupled to conductive traces on the upper surface and/or lower surface of IC 104a. In some embodiments, IC 104a may be coupled to pins and/or contacts for mounting the packaged IC 100a on a printed circuit board or in a socket. For example, IC 104a may be electrically coupled to the pins of a packaged grid array (PGA), the pins of a ball grid array (BGA), or the contacts of a land grid array (LGA).

Although FIG. 2 illustrates an electrical coupling between IC 104a and first packaging component 102a, embodiments are not limited in this regard. IC 104a may be communicatively coupled to first packaging component 102a and/or second packaging component 106a using any means known to one of ordinary skill in the art or otherwise suitable for communicative coupling, including but not limited to electrical coupling and/or optical coupling. Likewise, first packaging component 102a and/or second packaging component 106a may be configured for communicative coupling with other devices (e.g., other circuits connected to a printed circuit board) using any means know to one of ordinary skill in the art or otherwise suitable for communicatively coupling a packaged integrated circuit.

Figure 3:
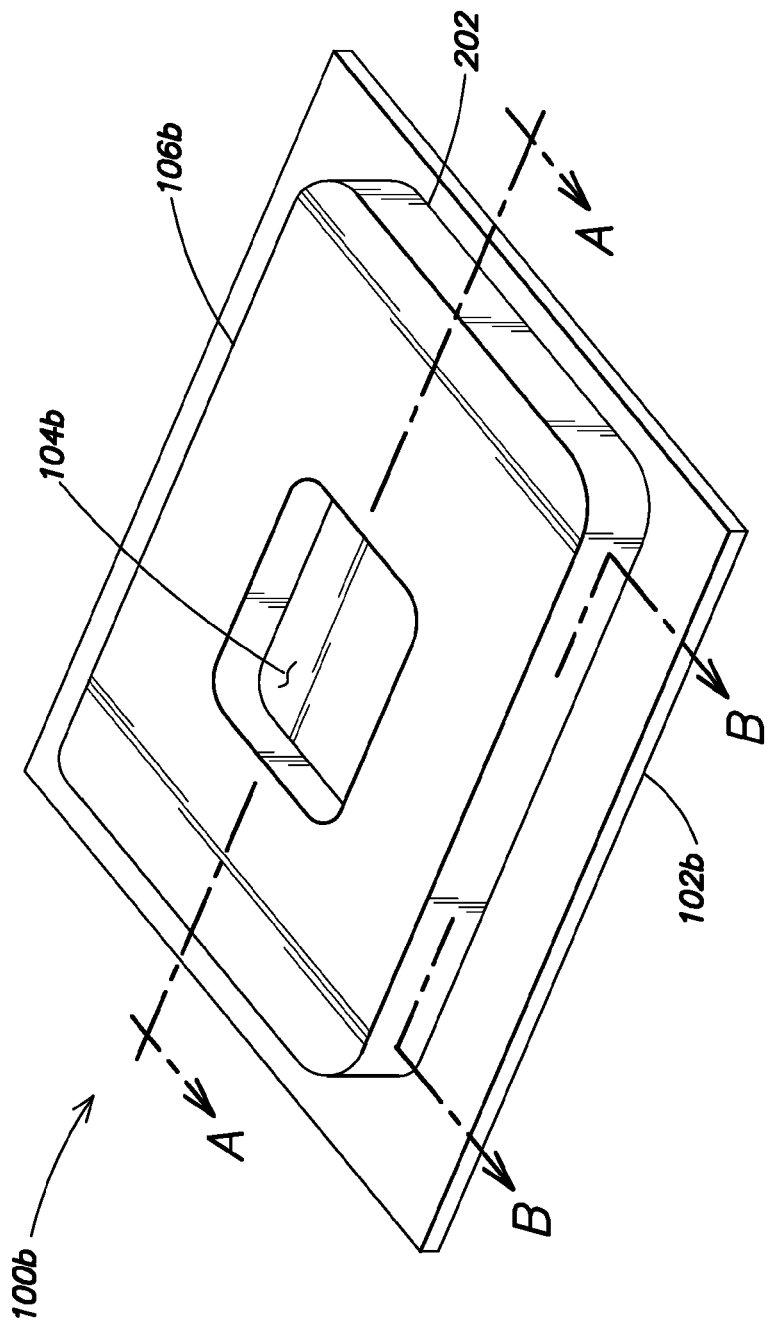
FIG. 3 shows a perspective view of a packaged integrated circuit 100b, according to some embodiments.

FIG. 3 shows a perspective view of a packaged integrated circuit 100b, according to some embodiments. In the packaged IC 100b of FIG. 3, an IC 104b is partially enclosed in an open cavity formed by first packaging component 102b and second packaging component 106b. At least a portion of IC 104b is accessible from outside the package formed by the first and second packaging components. In some embodiments, the accessible portion of IC 104b may include a sensor (e.g., a pressure sensor, an acoustic sensor, a light sensor, a microphone, etc.). In some embodiments, IC 104b may be attached to the first packaging component 102b and/or to the second packaging component 106b. IC 104b may be communicatively coupled to the first and/or second packaging component(s) (102b, 106b). In some embodiments, first packaging component 102b and second packaging component 106b may be attached to each other by an adhesive. In some embodiments, the adhesive may form a thin adhesive layer 202 between surfaces of the first and second packaging components (102b, 106b). Although a single IC 104b is visible in FIG. 3, some embodiments of packaged IC 100b may include two or more ICs. Although the perimeter of the first packaging component 102b extends beyond the perimeter of the second packaging component 106b in FIG. 3, in some embodiments the perimeters of the first and second packaging components may be coextensive in full or in part.

FIG. 4A shows a cross-section of packaged integrated circuit 100b along A-A, according to some embodiments. In the embodiment of FIG. 4A, second packaging component 106b is attached to first packaging component 102b by adhesive 202. In addition, first packaging component 102b is attached to a bottom surface 410 of IC 104b, and second packaging component 106b is attached to a top surface 412 of IC 104b. In some embodiments, IC 104b may be attached to first packaging component 102b and/or second packaging component 106b by an adhesive or a die attachment material 402.

In the example of FIG. 4A, packaged integrated circuit 100b forms a closed cavity 450 and an open cavity 451. The closed cavity 450 is bounded by a lower surface of second packaging component 106b, by an upper surface of first packaging component 102b, and by portions of IC 104b. In some embodiments, closed cavity 450 may include portions of IC 104b. In some embodiments, closed cavity 450 may include wires 112b which electrically couple IC 104b to contact pads 108b of first packing component 102b. In some embodiments, closed cavity 450 may be fully or partially filled with a filler substance (e.g., epoxy) to protect IC 104b from damage (e.g., corrosion) and/or from extreme temperatures.

The open cavity 451 is bounded by an upper surface 412 of IC 104b and by an outer surface of second packaging component 106b. In some embodiments, the portion of IC 104b that is accessible via open cavity 451 may include a sensor (e.g., an acoustic sensor, a pressure sensor, a temperature sensor, a microphone, etc.). In some embodiments, open cavity 451 may include the portions of IC 104b that are accessible via the open cavity.

FIG. 4B shows a cross-section of packaged integrated circuit 100b along A-A, according to some embodiments. In the embodiment of FIG. 4A, second packaging component 106b is attached to first packaging component 102b by adhesive 202. In addition, first packaging component 102b is attached to a bottom surface 410 of IC 104b (e.g., by an adhesive or a die attachment material 402). In the example of FIG. 4B, second packaging component 106b is not attached to a top surface 412 of IC 104b, and portions of second packaging component 106b are cantilevered above first packaging component 102b and/or IC 104b.

In the example of FIG. 4B, packaged integrated circuit 100b forms an open cavity 452. The open cavity 452 is bounded by surfaces of first packaging component 102b, second packaging component 106b, and IC 104b. In some embodiments, open cavity 452 may include IC 104b. In some embodiments, an entire upper surface 412 of IC 104b may be accessible via open cavity 452. For example, an entire upper surface 412 of IC 104b may be accessible to air, to touch, to light, to acoustic waves, and/or to other sources of sensory input. In some embodiments, portions of the upper surface 412 of IC 104b may be accessible to some sensory inputs and inaccessible to other sensory inputs. In some embodiments, portions of IC 104b may be inaccessible to all sensory inputs. In some embodiments, portions of the open cavity 452 may be filled with a protective a filler substance (e.g., epoxy), which may cover portions of the upper surface 412 of IC 104b.

Figure 4C:
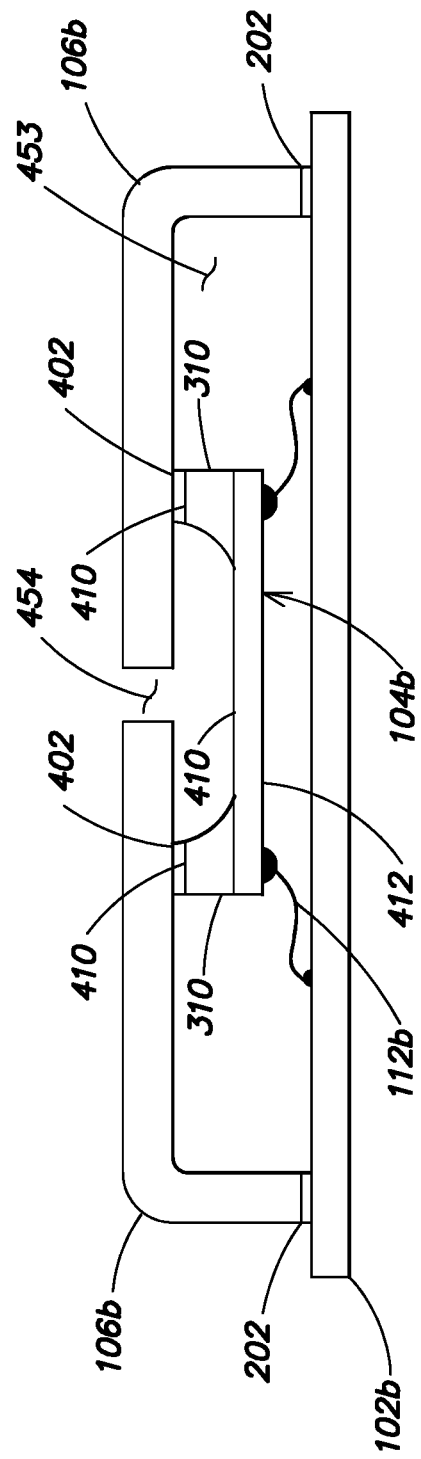
FIG. 4C shows another cross-section of packaged integrated circuit 100b along A-A, according to some embodiments.

FIG. 4C shows a cross-section of packaged integrated circuit 100b along A-A, according to some embodiments. In the embodiment of FIG. 4C, second packaging component 106b is attached to first packaging component 102b by adhesive 202. In addition, second packaging component 106b is attached to a bottom surface 410 of IC 104b (e.g., by an adhesive or a die attachment material 402). In the example of FIG. 4C, first packaging component 106b is not attached to a top surface 412 of IC 104b, though first packaging component 106b may be communicatively coupled to IC 104b via wires 112b, according to some embodiments.

In the example of FIG. 4C, the substrate 310 of IC 104b is formed such that one or more layers of IC 104b are suspended. The suspended portion of IC 104b may include, for example, a MEMS device, such as a MEMS sensor.

In the example of FIG. 4C, packaged integrated circuit 100b forms a closed cavity 453 and an open cavity 454. The closed cavity 453 is bounded by a lower surface of second packaging component 106b, by an upper surface of first packaging component 102b, and by portions of IC 104b. In some embodiments, closed cavity 453 may include portions of IC 104b. In some embodiments, closed cavity 453 may be fully or partially filled with a filler substance (e.g., epoxy) to protect IC 104b from damage (e.g., corrosion) and/or from extreme temperatures.

The open cavity 454 is bounded by surfaces of second packaging component 102b and IC 104b. In some embodiments, open cavity 454 may include portions of IC 104b. In some embodiments, portions of lower surface 410 of IC 104b may be accessible via open cavity 454. For example, a lower surface 410 of a suspended portion of IC 104b may be accessible to air, to touch, to light, to acoustic waves, and/or to other sources of sensory input.

FIGS. 4A-4C illustrate embodiments of open-cavity integrated circuit packaging. Embodiments are not lit limited to the examples illustrated in FIGS. 4A-4C. In some embodiments, the elements of packaged IC 100b may be arranged in any way known to one of ordinary skill in the art or otherwise suitable for packaging an integrated circuit such that at least a portion of the integrated circuit is accessible via an open cavity of the IC package.

Figure 5A:
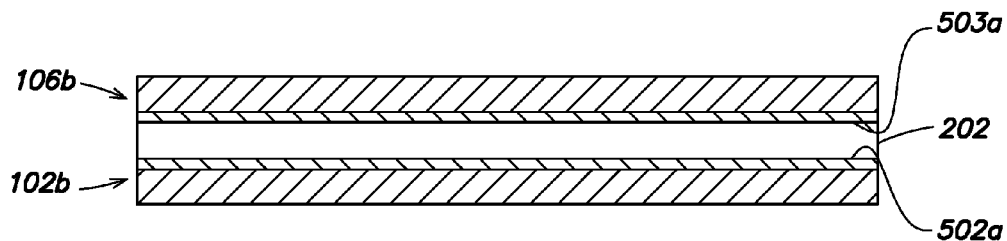
FIG. 5A shows a cross-section of packaged integrated circuit 100b along B-B, according to some embodiments.

FIG. 5A shows a cross-section of packaged integrated circuit 100b along B-B, according to some embodiments. In the example of FIG. 5A, first packaging component 102b is attached to second packaging component 106b by an adhesive 202 applied between a surface 502a of first packaging component 102b and a surface 503a of second packaging component 106b. In the example of FIG. 5A, surfaces 502a and 503a are not patterned (e.g., not formed according to a pattern, such as a pattern of cavities and/or protrusions). In some embodiments, surfaces 502a and 503a may be substantially smooth. In embodiments of packaged IC 100b where the surfaces (502a and 503a) of first and second packaging components (102b and 106b, respectively) are substantially smooth, cracks that form in adhesive 202 (e.g., as a result of dropping an electronic device containing IC 100b) may tend to propagate through the adhesive 202, causing the first and second packaging components to become detached from each other.

Figure 5B:
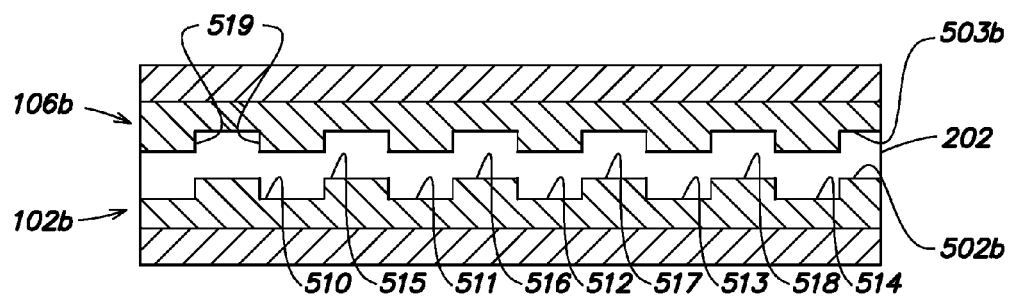
FIG. 5B shows another cross-section of packaged integrated circuit 100b along B-B, according to some embodiments.

FIG. 5B shows another cross-section of packaged integrated circuit 100b along B-B, according to some embodiments. In the example of FIG. 5B, first packaging component 102b is attached to second packaging component 106b by an adhesive 202 applied between a surface 502b of first packaging component 102b and a surface 503b of second packaging component 106b. In the example of FIG. 5B, each of the surfaces (502b and 503b) is patterned (e.g., formed according to a pattern). In particular, surfaces 502b and 503b are both patterned according to patterns of cavities and/or protrusions. For example, surface 502b may be formed according to a pattern of cavities (510-514), according to a pattern of protrusions (515-518), or according to a pattern of cavities and protrusions (510-518).

In the example of FIG. 5B, the pattern of surface 502b alternates with the pattern of surface 503b. As an example of how the surface patterns alternate, at least some of the protrusions of surface 502b are horizontally aligned with cavities of surface 503b, and at least some of the cavities of surface 502b are horizontally aligned with protrusions of surface 503b. As another example of how the surface patterns alternate, the aligned cavities and the corresponding aligned protrusions have matching widths (e.g., widths that are equal or approximately equal). As another example of how the surface patterns alternate, the heights of at least some of the protrusions in surface 502b match the depths of the corresponding cavities in surface 503b, and the depths of at least some of the cavities in surface 502b match the heights of the corresponding protrusions in surface 503b.

In embodiments of packaged IC 100b where the surfaces (502b and 503b) of first and second packaging components (102b and 106b, respectively) are patterned as illustrated in FIG. 5B, the cavities and/or protrusions in the surfaces may tend to terminate the propagation of cracks that form in adhesive 202 (e.g., as a result of dropping an electronic device containing IC 100b), thereby maintaining the adhesive attachment between the first and second packaging components. For example, in some embodiments, the sidewalls 519 of cavities and/or protrusions in the surfaces may terminate the propagation of cracks before the cracks detach the packaging components from one another.

Figure 5C:
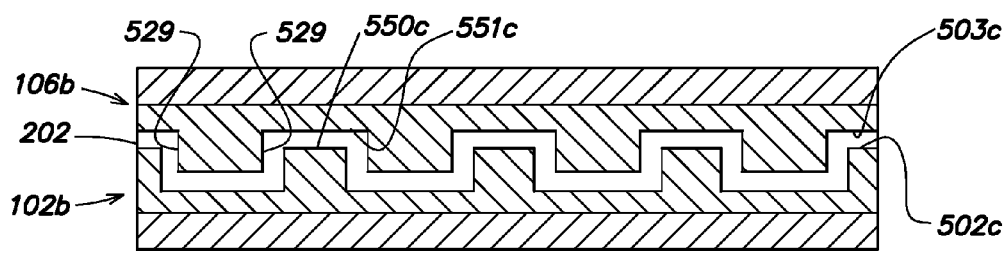
FIG. 5C shows another cross-section of packaged integrated circuit 100b along B-B, according to some embodiments.

FIG. 5C shows another cross-section of packaged integrated circuit 100b along B-B, according to some embodiments. In the example of FIG. 5C, first packaging component 102b is attached to second packaging component 106b by an adhesive 202 applied between a surface 502c of first packaging component 102b and a surface 503c of second packaging component 106b. In the example of FIG. 5C, each of the surfaces (502b and 503b) is patterned (e.g., formed according to a pattern). In particular, surfaces 502c and 503c are both patterned according to patterns of cavities and/or protrusions.

In the embodiment of FIG. 5C, surfaces 502c and 503c are patterned and arranged such that at least one protrusion formed by one of the surface layers extends at least partially into a cavity formed by the other surface layer. For example, protrusion 550c extends into cavity 551c. Interlocking at least some of the cavities and protrusions of surfaces 502c and 503c in this matter may increase the ability of packaged IC 100b to resist cracking (e.g., when the packaged IC is dropped).

In the example of FIG. 5C, the pattern of surface 502c alternates with the pattern of surface 503c. As an example of how the surface patterns alternate, at least some of the protrusions of surface 502c are horizontally aligned with cavities of surface 503c, and at least some of the cavities of surface 502c are horizontally aligned with protrusions of surface 503c. In contrast to the example of FIG. 5B, in which the aligned cavities and protrusions have matching widths, in the example of FIG. 5C, the widths of the aligned cavities exceed the widths of the corresponding aligned protrusions. As another example of how the surface patterns alternate, the heights of at least some of the protrusions in surface 502c match the depths of the corresponding cavities in surface 503c, and the depths of at least some of the cavities in surface 502c match the heights of the corresponding protrusions in surface 503c.

In embodiments of packaged IC 100b where the surfaces (502c and 503c) of first and second packaging components (102b and 106b, respectively) are patterned as illustrated in FIG. 5C, the cavities and/or protrusions in the surfaces may tend to terminate the propagation of cracks that form in adhesive 202 (e.g., as a result of dropping an electronic device containing IC 100b), thereby maintaining the adhesive attachment between the first and second packaging components. For example, in some embodiments, the sidewalls 529 of cavities and/or protrusions in the surfaces may terminate the propagation of cracks before the cracks detach the packaging components from one another.

Figure 5D:
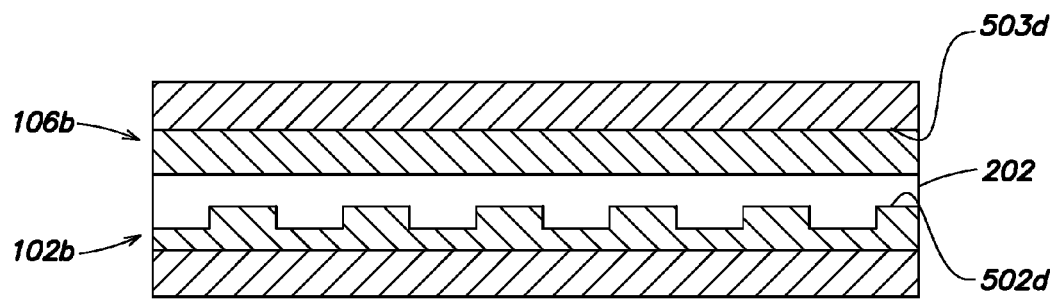
FIG. 5D shows another cross-section of packaged integrated circuit 100b along B-B, according to some embodiments.
Figure 5E:
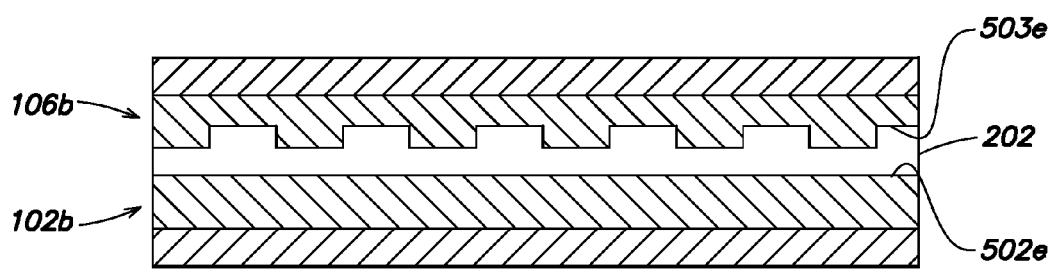
FIG. 5E shows another cross-section of packaged integrated circuit 100b along B-B, according to some embodiments.

Although FIGS. 5B and 5C illustrate embodiments in which the surfaces of both the first packaging component 102*b* and the second packaging component 106*b* are patterned, embodiments are not limited in this regard. In some embodiments, the surface of one packaging component may be patterned and the surface of the other packaging component may be non-patterned (e.g., substantially smooth). For example, in FIG. 5D (which shows another cross-section of packaged integrated circuit 100*b* along B-B, according to some embodiments), surface 502*d* of first packaging component 102*b* is patterned according to a pattern of cavities and/or protrusions, and surface 503*d* of second packaging component 106*b* is non-patterned. Likewise, in FIG. 5E (which shows another cross-section of packaged integrated circuit 100*b* along B-B, according to some embodiments), surface 502*e* of first packaging component 102*b* is non-patterned, and surface 503*d* of second packaging component 106*b* is patterned according to a pattern of cavities and/or protrusions.

Although FIGS. 5B-5E illustrate embodiments in which the pattern elements (e.g., cavities and/or protrusions) formed in the surfaces of the packaging component alternate and have substantially uniform geometries (e.g., widths, depths, and shapes), embodiments are not limited in this regard. In some embodiments, pattern elements may not alternate. In some embodiments, the geometries (e.g., widths, depths, and/or shapes) of pattern elements may vary between pattern elements in the same surface and/or between pattern elements on different surfaces.

Figure 5F:
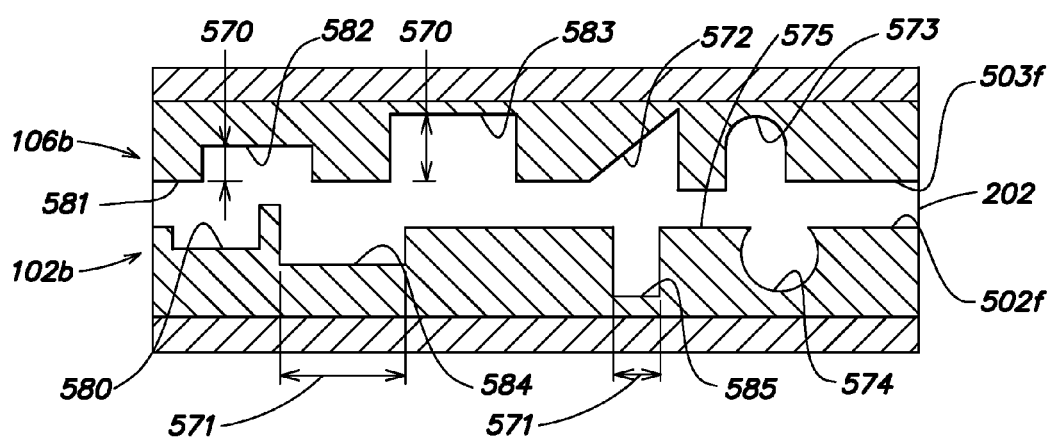
FIG. 5F shows another cross-section of packaged integrated circuit 100b along B-B, according to some embodiments.

FIG. 5F shows another cross-section of packaged IC 100*b* along B-B, according to some embodiments. In the example of FIG. 5F, the pattern elements of surfaces 502*f* and 503*f* do not alternate. For example, cavity 580 of surface 502*f* is horizontally aligned with a portion of protrusion 581 of surface 503*f* and with a portion of cavity 582 of surface 503*f*. Also, in the example of FIG. 5, the geometries of the pattern elements are non-uniform. For example, the depths 570 of cavities 582 and 583 are different, and the widths 571 of cavities 584 and 585 are different. As another example, several of the cavities and/or protrusions have cross-sectional areas that are substantially rectangular (e.g., pattern elements 581-585), while other cavities and/or protrusions have cross-sectional areas that are not rectangular (e.g., pattern elements 572-575). In some embodiments, the depth or height of a pattern element (e.g., a cavity or a protrusion) may range from 0.02 to 0.05 mm. In some embodiments, the width or length of a pattern element (e.g., a cavity or a protrusion) may range from, for example, 0.22 to 0.50 mm. In some embodiments, the perimeters of the pattern elements may be roughly circular in shape.

Embodiments of a patterned surface may be patterned according to a repeating pattern or a non-repeating pattern. When a patterned surface is patterned according to a repeating pattern, the patterned surface may include a sequence of repeating pattern elements (e.g., cavities and/or protrusions). Surfaces 502*b*, 503*b*, 502*c*, 503*c*, 502*d*, and 503*e*, as shown in FIGS. 5B-5E, are examples of surfaces that are patterned according to a repeating pattern. When a patterned surface is patterned according to a non-repeating pattern, the patterned surface may not include a sequence of repeating pattern elements (e.g., cavities and/or protrusions). Surfaces 502*f* and 503*f*, as shown in FIG. 5F, are examples of surfaces that are patterned according to a non-repeating pattern.

Although FIGS. 5A-5F illustrate structures and techniques for using an adhesive to attach a first packaging component 102*b* to a second packaging component 106*b*, embodiments are not limited in this regard. The structures (e.g., patterned surfaces) and techniques (e.g., alternating pattern elements of opposing patterned surfaces) illustrated in FIGS. 5A-5F may be applied to the surfaces of any components of packaged IC 100*b* that are attached (e.g., by an adhesive or a die attach material). For example, where a top surface 412 of an IC 104*b* is attached to a second packaging component 106*b* by a die attach material 402, as shown in FIG. 4A, the top surface 412 of the IC 104*b* and/or the surface of the second packaging component 102*b* may be patterned. As another example, where a bottom surface 410 of an IC 104*b* is attached to a first packaging component 102*b* by a die attach material 402, as shown in FIG. 4A, the bottom surface 410 of the IC 104*b* and/or the surface of the first packaging component 102*b* may be patterned. As yet another example, where a bottom surface 410 of an IC 104*b* is attached to a second packaging component 106*b* by a die attach material 402, as shown in FIG. 4C, the bottom surface 410 of the IC 104*b* and/or the surface of the second packaging component 106*b* may be patterned.

In some embodiments, a patterned surface of a structure (such as, for example, patterned surface 502*b* of first packaging component 102*b*) may be formed in a surface layer of the structure. A surface layer may be a layer of material that forms a surface of the structure. In some embodiments, a surface layer may differ from the portion of the structure on which the surface layer is deposited (e.g., the chemical composition and/or physical properties of a surface layer may differ from the chemical composition and/or physical properties of the portion of the structure under the surface layer, or the surface layer may not be integrally formed with the portion of the structure under the surface layer). For example, in some embodiments, a patterned surface may be formed in a surface layer of solder mask that is applied to a packaging component, or in a surface layer of a suitable material that is applied to an integrated circuit. The surface layer (e.g., solder mask) may be applied to the corresponding structure and patterned using any means known to one of ordinary skill in the art or otherwise suitable for applying a surface layer to a component of a packaged IC and patterning the surface layer, including but not limited to screen printing the surface layer, depositing and etching the surface layer, depositing and photo-lithographically patterning the surface layer, and/or extruding the surface layer.

Whether a pattern element of a patterned surface is regarded as a 'cavity' or a 'protrusion' may depend, for example, on how the pattern element is formed (e.g., a cavity may be a pattern element formed by removing a portion of a surface layer, and a protrusion may be a pattern element formed by depositing a portion of a surface layer), or on the height of the pattern element relative to a reference height (e.g., a cavity may be a pattern element in which the height of the surface is below a reference height, and a protrusion may be a pattern element in which the height of the surface is above a reference height).

Although each of the patterned surfaces (502*b*, 503*b*, 502*c*, 503*c*, 502*d*, 503*e*, 502*f*, 503*f*) illustrated in FIGS. 5B-5F is formed according to a pattern of cavities and/or protrusions, embodiments are not limited in this regard. In some embodiments, a patterned surface may be formed according to a pattern of any pattern elements known to one of ordinary skill in the art or otherwise suitable for terminating the propagation of a crack through an adhesive 202 or a die attach material applied to the patterned surface.

Figure 6A:
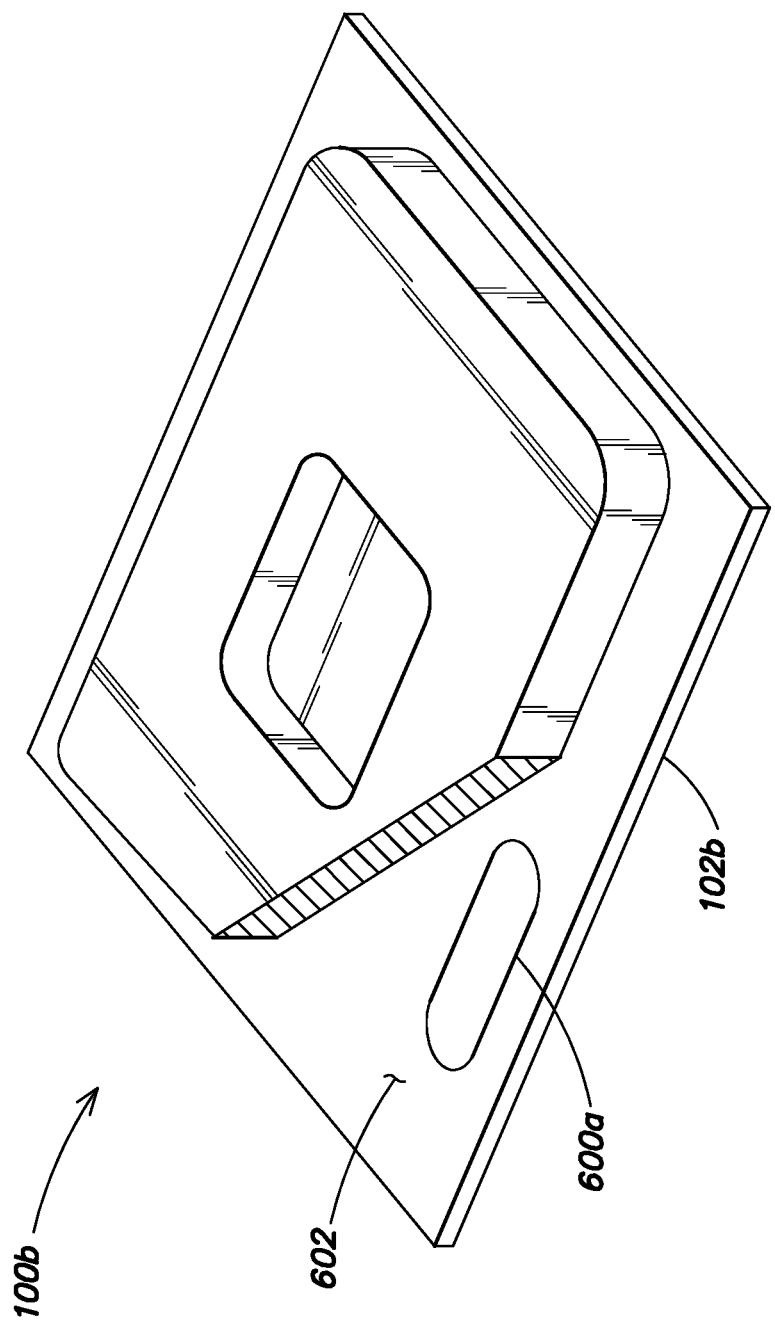
FIG. 6A shows a cutaway top perspective view of a packaged integrated circuit 100b, according to some embodiments.
Figure 6B:
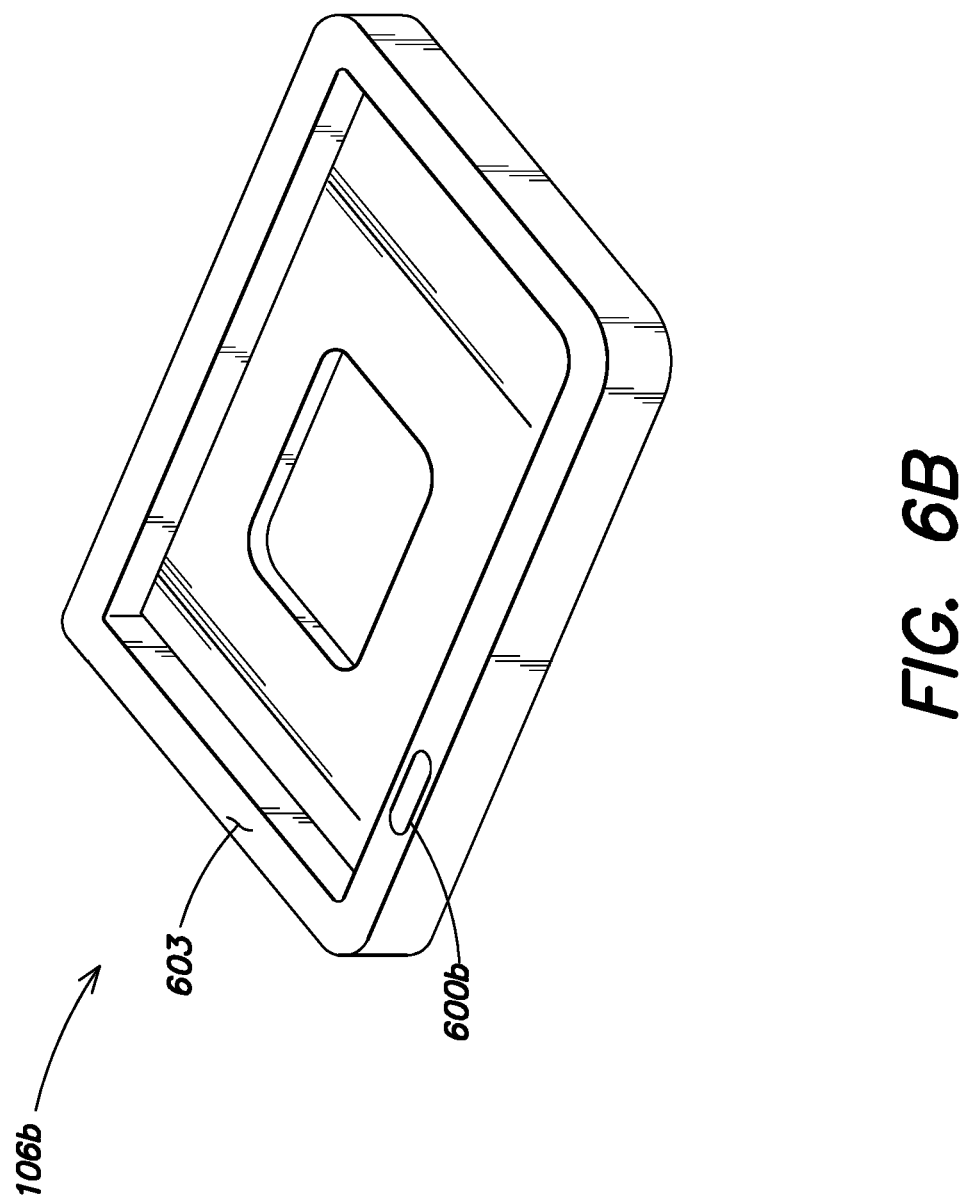
FIG. 6B shows a bottom perspective view of a second packaging component 106b, according to some embodiments.

FIG. 6A shows a cutaway top perspective view of a packaged integrated circuit 100b, according to some embodiments. In FIG. 6A, a portion 600a of a patterned surface 602 of first packaging component 102b is identified. FIG. 6B shows a bottom perspective view of a second packaging component 106b, according to some embodiments. In FIG. 6B, a portion 600b of a patterned surface 603 of second packaging component 106b is identified.

Figure 6C:
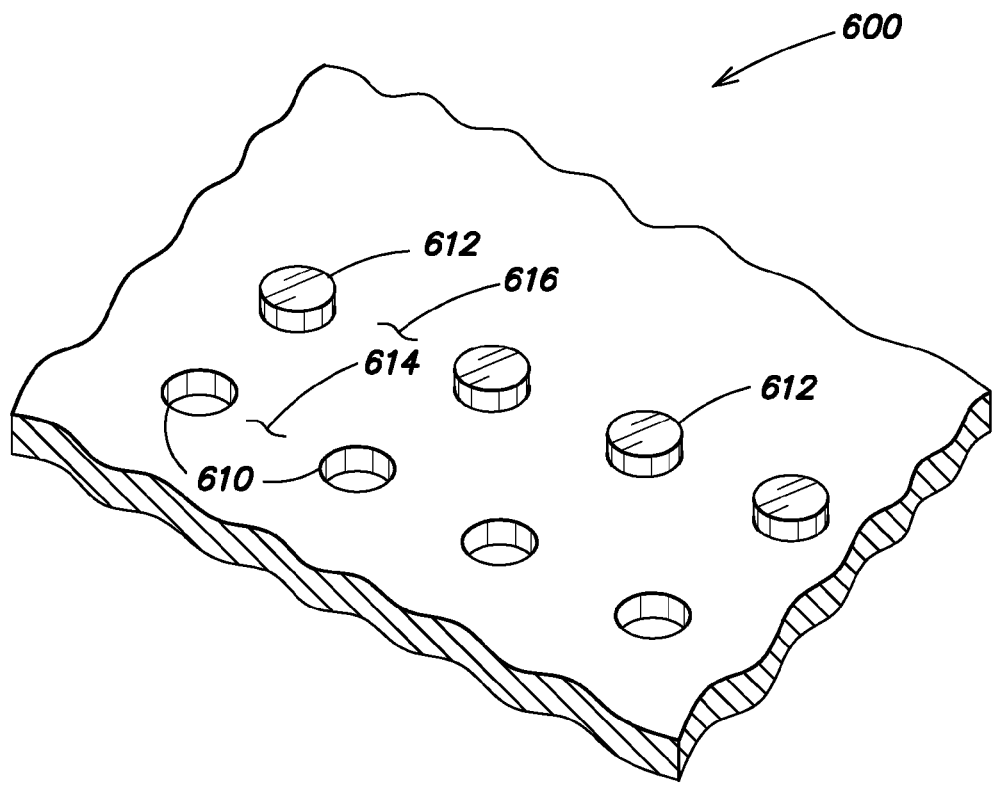
FIG. 6C shows a perspective view of a portion 600 of a patterned surface, according to some embodiments.

FIG. 6C shows a perspective view of a portion 600 of a patterned surface, according to some embodiments. Portion 600 may correspond, for example, to portion 600a of patterned surface 602 of FIG. 6A, or to portion 600b of patterned surface 603 of FIG. 6B. In the embodiment of FIG. 6C, the portion 600 of the patterned surface is patterned according to a pattern of cavities (e.g., 610) and protrusions (e.g., 612). In some embodiments, element 614 may be a protrusion. In some embodiments, element 616 may be a cavity.

Figure 7:
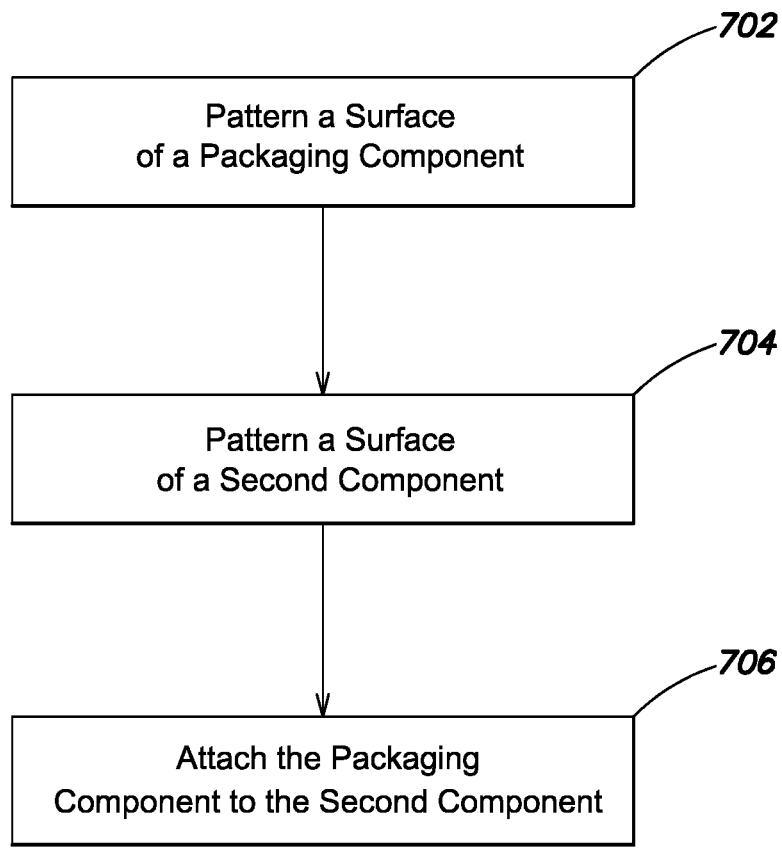
FIG. 7 shows a flowchart of an integrated circuit packaging method, according to some embodiments.

FIG. 7 shows a flowchart of an integrated circuit packaging method, according to some embodiments. At step 702, the surface of a packaging component is patterned. In some embodiments, the surface of the packaging component may be patterned by forming a material (e.g., a material of a surface layer of the packaging component) according to a pattern (e.g., a pattern of cavities and/or protrusions). In some embodiments, the material may be formed according to the pattern by screen printing the material according to the pattern, by depositing the material and removing a portion of the material according to the pattern, and/or by depositing the material and photo-lithographically patterning the material according to the pattern. In some embodiments the pattern may be a repeating pattern (e.g., a pattern which includes a sequence of repeating pattern elements). In some embodiments the material that is formed according to the pattern may be solder mask.

At step 704, the surface of a second component is patterned. The second component may be, for example, an integrated circuit or a second packaging component. The surface of the second component may be for adhesively coupling to the surface of the packaging component. In some embodiments, the surface of the second component may be patterned by forming a material (e.g., a surface layer of the second component) according to a pattern (e.g., a pattern of cavities and/or protrusions). In some embodiments, the material may be formed according to the pattern by screen printing the material according to the pattern, by depositing the material and removing a portion of the material according to the pattern, and/or by depositing the material and photo-lithographically patterning the material according to the pattern. In some embodiments the pattern may be a repeating pattern. In some embodiments the material that is formed according to the pattern may be solder mask.

In some embodiments, the pattern elements (e.g., cavities and/or protrusions) of the pattern formed in the surface of the second component may alternate with the pattern elements (e.g., cavities and/or protrusions) of the pattern formed in the surface of the packaging component. For example, the patterns of the packaging component and the second component may alternate such that protrusions in the surface of the packaging component align with cavities in the surface of the second component, or such that cavities in the surface of the second component align with protrusions in the surface of the packaging component.

In some embodiments the packaging component may be, for example, a substrate such as printed circuit board. In some embodiments the second component may be a packaging component such as a lid. In some embodiments, each of the packaging components may include ceramic, metal, plastic, and/or glass.

At step 706, the packaging component is attached to the second component. In some embodiments, attaching the packaging component the second component may include forming an adhesive layer between the surface of the packaging component and the surface of the second component. In some embodiments, the adhesive layer may conform to the pattern of pattern elements (e.g., cavities and/or protrusions) in the surface of the packaging component. In some embodiments, the adhesive layer may conform to the pattern of pattern elements (e.g., cavities and/or protrusions) in the surface of the second component. In some embodiments, when the packaging component and the second component are attached, they may form an open cavity package. In some embodiments, at least a portion of an integrated circuit may be accessible via a cavity of the open cavity package. In some embodiments, the integrated circuit may include a sensor, such as, for example, a pressure sensor, an acoustic sensor, or a microphone. In some embodiments, the sensor may be a micro-electromechanical system (MEMS) device.

Embodiments of the integrated circuit packaging method do not necessarily include all steps illustrated in FIG. 7. Some embodiments may include a single step illustrated in FIG. 7. In embodiments of the packaging method that include two or more of the steps illustrated in FIG. 7, the steps are not necessarily performed in the order shown in FIG. 7. For example, steps 702 and 704 could be performed simultaneously, or step 704 could be performed before step 702. As another example, step 702 or step 704 could be omitted.

Although the foregoing disclosure describes techniques and devices for packaging an integrated circuit, embodiments are not limited in this regard. The techniques and devices described herein may be used to package any electrical, mechanical, or optical device known to one of ordinary skill in the art or otherwise suitable for being packaged, including but not limited to any semiconductor die.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A packaged device comprising:
   an integrated circuit;
   a first packaging component, at least a portion of a surface of the first packaging component being formed in a pattern of one or more protrusions and/or one or more cavities;
   a second packaging component, at least a portion of a surface of the second packaging component or the integrated circuit being formed in a pattern of one or more cavities and/or one or more protrusions; and
   an adhesive layer disposed between at least the patterned portion of the surface of the first packaging component and at least the patterned portion of the surface of the second packaging component or integrated circuit, wherein the integrated circuit is at least partially enclosed between the first and second packaging components.

2. The packaged device of claim 1, wherein the pattern in at least the portion of the surface of the first packaging component is a repeating pattern.

3. The packaged device of claim 1, wherein the patterned portion of the surface of the first packaging component includes at least one cavity having a depth between 0.02 mm and 0.05 mm.

4. The packaged device of claim 1, wherein the patterned portion of the surface of the first packaging component includes at least one cavity having a length between 0.22 mm and 0.50 mm, and/or having a width between 0.22 mm and 0.50 mm.

5. The packaged device of claim 1, wherein the patterned portion of the surface of the first packaging component includes at least one protrusion having a height between 0.02 mm and 0.05 mm.

6. The packaged device of claim 1, wherein the patterned portion of the surface of the first packaging component includes at least one protrusion having a length between 0.22 mm and 0.50 mm, and/or having a width between 0.22 mm and 0.50 mm.

7. The packaged device of claim 1, wherein the patterned portion of the surface of the first packaging component is formed from a material, and wherein the material includes solder mask.

8. The packaged device of claim 1, wherein at least a portion of a surface of the adhesive layer conforms to the pattern in at least the portion of the surface of the first packaging component.

9. The packaged device of claim 1, wherein the pattern of one or more cavities and/or protrusions in at least the portion of the surface of the second packaging component differs from the pattern of one or more cavities and/or protrusions in at least the portion of the surface of the first packaging component.

10. The packaged device of claim 1, wherein the pattern of one or more cavities and/or protrusions in at least the portion of the surface of the second packaging component alternates with the pattern of one or more cavities and/or protrusions in at least the portion of the surface of the first packaging component.

11. The packaged device of claim 1, wherein the first and second packaging components form an open-cavity package, and wherein at least a portion of the integrated circuit is accessible via a cavity of the open-cavity package.

12. The packaged device of claim 10, wherein the first packaging component is a substrate.

13. The packaged device of claim 10, wherein the first packaging component is a lid.

14. The packaged device of claim 1, wherein at least a portion of the surface of the integrated circuit is formed according to a pattern of one or more cavities and/or protrusions.

15. The packaged device of claim 1, wherein the integrated circuit comprises a sensor.

16. The packaged device of claim 15, wherein the sensor is a pressure sensor, an acoustic sensor, or a microphone.

17. The packaged device of claim 15, wherein the sensor is a MEMS (micro-electromechanical system) device.

18. An electronic device comprising the packaged device of claim 1, wherein the electronic device is a portable computing device, tablet computer, mobile phone, smart phone, and/or electronic navigation device.

* * * * *